(12) United States Patent
Seeman

(10) Patent No.: US 9,606,151 B2
(45) Date of Patent: Mar. 28, 2017

(54) CAPACITIVE CURRENT SENSING USING A CURRENT FEEDBACK AMPLIFIER

(71) Applicant: Texas Instruments Incorporated, Dallas, TX (US)

(72) Inventor: Michael D. Seeman, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 84 days.

(21) Appl. No.: 14/327,331

(22) Filed: Jul. 9, 2014

(65) Prior Publication Data

US 2016/0011242 A1    Jan. 14, 2016

(51) Int. Cl.
| | | |
|---|---|---|
| *G01R 19/00* | (2006.01) | |
| *G01R 1/30* | (2006.01) | |
| *H03F 3/04* | (2006.01) | |
| *H03F 3/45* | (2006.01) | |
| *H03F 3/217* | (2006.01) | |
| *H02M 1/00* | (2006.01) | |

(52) U.S. Cl.
CPC ........... *G01R 19/0092* (2013.01); *G01R 1/30* (2013.01); *H03F 3/04* (2013.01); *H03F 3/2173* (2013.01); *H03F 3/45071* (2013.01); *H03F 3/45475* (2013.01); *H02M 2001/0009* (2013.01); *H03F 2200/129* (2013.01); *H03F 2200/351* (2013.01); *H03F 2203/45022* (2013.01); *H03F 2203/45156* (2013.01); *H03F 2203/45528* (2013.01)

(58) Field of Classification Search
CPC ................. H03F 3/08; H03F 2200/129; H03F 2203/45022; H03F 2203/45156; H03F 3/005; H03F 3/04; H03F 3/45071; G01D 5/2412; G01D 5/2417; G01R 19/0092; G01R 1/30
USPC .................................. 324/658, 674, 686, 681
See application file for complete search history.

(56) References Cited

U.S. PATENT DOCUMENTS

| | | | | |
|---|---|---|---|---|
| 4,963,829 | A * | 10/1990 | Wereb ................. | G01D 5/2417 324/176 |
| 6,218,905 | B1 * | 4/2001 | Sanders ................ | H03F 3/082 250/214 A |
| 6,731,121 | B1 | 5/2004 | Hsu et al. | |
| 2007/0210777 | A1 * | 9/2007 | Cervera ............... | H02M 3/157 323/284 |

(Continued)

FOREIGN PATENT DOCUMENTS

| | | |
|---|---|---|
| EP | 0516902 A1 | 12/1992 |
| RU | 2452075 C1 | 5/2012 |

OTHER PUBLICATIONS

International Search Report and Written Opinion for PCT/US2014/058197 mailed Apr. 9, 2015.

*Primary Examiner* — Vincent Q Nguyen
(74) *Attorney, Agent, or Firm* — Michael A. Davis, Jr.; Charles A. Brill; Frank D. Cimino

(57) ABSTRACT

A circuit for sensing current in a capacitive network. A first capacitor carries a first current. A second capacitor is connected to the first capacitor thereby forming a current divider. The second capacitor carries a second current which is proportional to the first current. A transimpedance amplifier is connected to the second capacitor and has a voltage output that is proportional to the second current. Using a current feedback amplifier as the transimpedance amplifier significantly improves bandwidth and stability.

13 Claims, 2 Drawing Sheets

(56) References Cited

U.S. PATENT DOCUMENTS

2009/0251925 A1* 10/2009 Usui ................. H02M 3/33561
                                                        363/16
2011/0227547 A1*  9/2011 Wong .................... H02M 3/156
                                                        323/282
2012/0069606 A1   3/2012 Sagneri et al.

* cited by examiner

CAPACITIVE CURRENT SENSING USING A CURRENT FEEDBACK AMPLIFIER

TECHNICAL FIELD

This disclosure relates in general to electronic circuits, and in particular to a circuit and method for sensing current in a capacitive electronic network within an isolated switching power converter.

BACKGROUND

A DC-DC converter is an electronic circuit that converts a source of direct current from one voltage level to another. DC-DC converters are widely used in portable electronic devices to provide power from a battery as well as following stages to an AC-DC converter, and are used generally in electronic circuits to regulate an output voltage. For example, a DC-DC converter may be used to compensate for varying load current and/or variations in the input voltage.

Measuring current in a DC-DC converter is useful and necessary for a wide variety of control and safety purposes, and it is desirable to do so inexpensively with minimal power loss. However, such measurements can be difficult or require additional components, particularly in switched power converters.

For example, an isolated switched converter, such as an LLC series-resonant converter, has an input powered from a high-voltage DC source. The circuit includes a half-bridge power stage which is connected to the series elements of an LLC resonant circuit. The LLC resonant circuit is formed by a series combination of a magnetizing inductance and a transformer, and a combined capacitance on the output side of the bridge.

A typical solution for sensing the current adds a DC resistor in the primary circuit and senses the voltage drop over the resistor. While this solution is inexpensive, it also creates additional loss and reduces the overall efficiency of the power converter. Another solution is to incorporate a Hall Effect sensor. A Hall Effect sensor is a transducer that senses the magnetic field generated by a current-carrying conductor and generates an output signal (voltage or current) in response to the magnetic field. However, this solution is expensive and complex. An additional solution utilizes a capacitor connected to a capacitive node, but provides limited bandwidth and accuracy.

Thus, it would be desirable to develop an effective alternative solution for accurately sensing current that is inexpensive, does not result in significant power loss, and has a low component count.

DETAILED DESCRIPTION

This disclosure describes a circuit for sensing current in a capacitive network. For example, a series-resonant DC-DC converter includes a resonant capacitor coupled (e.g., connected) between a first node and ground, wherein the resonant capacitor carries the primary current (i.e. the current to be measured). A sense capacitor is coupled to the resonant capacitor to form a current divider. A sense current flows through the sense capacitor that is proportional to the primary current through the resonant capacitor. A transimpedance amplifier is coupled to the sense capacitor and generates a voltage output that is proportional to the sense current flowing through the sense capacitor. In an embodiment, the transimpedance amplifier is implemented using a current feedback amplifier.

Figure 1:
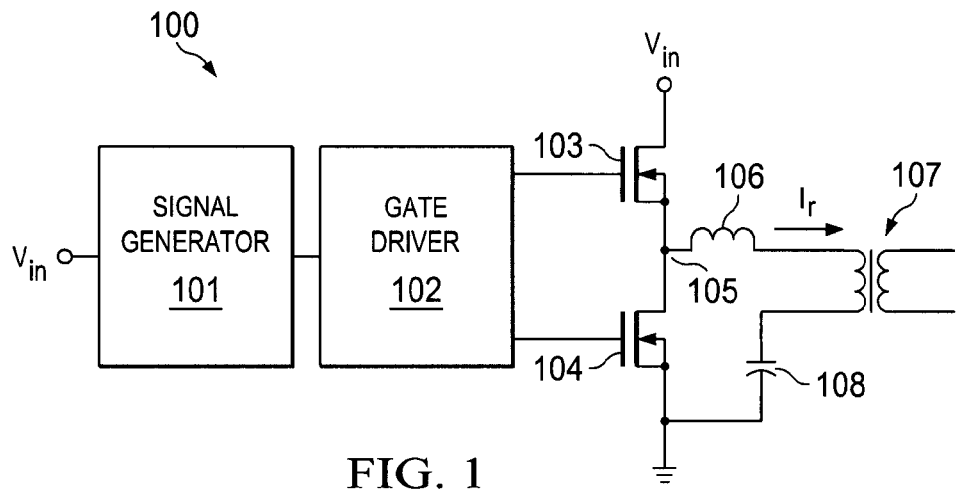
FIG. 1 is a circuit schematic of a primary side circuit for a half-bridge-based LLC resonant isolated power converter.

FIG. 1 is a simplified circuit schematic of a primary side circuit for an isolated power converter illustrating a conventional DC-DC converter 100. A PWM signal generating stage 101 generates logic voltage level PWM signals referenced to ground. A gate driver stage 102 is coupled to the signal generating stage 101 and provides a PWM signal to the gate of a high-side power transistor 103 and an inverted, non-overlapping PWM signal to the gate of a low-side power transistor 104. The signal generating stage 101 and the gate driver stage 102 can be separate modules or fully integrated in a single control, logic and driver integrated circuit.

The drain of the high-side power transistor 103 is coupled to a voltage supply terminal to which the voltage $V_{in}$ is applied. The source of the high-side power transistor 103 is coupled to the drain of the low-side power transistor 104 at a switching node 105. The source of the low-side power transistor 104 is coupled to a second voltage supply terminal which is coupled to ground. An inductor 106 has one end coupled to the switching node 105 and the other end coupled to a primary winding of transformer 107. A capacitor 108 is coupled between the other end of the primary winding of transformer 107 and ground and carries the primary current $I_r$ that needs to be sensed. In some embodiments, multiple capacitors may be coupled between the primary winding of transformer 107 and ground, and the current $I_r$ is then the sum of currents through the multiple capacitors. The secondary winding(s) of transformer 107 are connected to a rectifier circuit (not shown) to generate an isolated DC voltage output from the current developed across the inductor 106.

Figure 2:
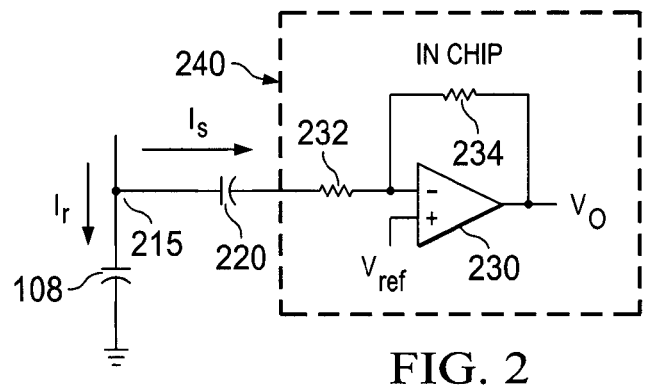
FIG. 2 is a circuit schematic of a transimpedance amplifier used to sense current in the circuit of FIG. 1.

FIG. 2 is a circuit schematic of a transimpedance amplifier 240 used to sense current in the circuit of FIG. 1, and shows only the resonant capacitor 108 of circuit 100 coupled to a common reference, such as ground, or a power rail with a DC offset from ground, or a voltage reference or other voltage with a DC offset (and low impedance) from ground, for example. A smaller sense capacitor 220 is coupled in parallel with the resonant capacitor at node 215 thereby forming a current divider. The sense capacitor 220 is typically an external component in many converter implementations, but could also be integrated on chip. The sense capacitor 220 is tied not to a direct ground, but to a virtual ground or common reference in the form of a sense network. In an embodiment, the sensing network is the transimpedance amplifier 240. The sense current $I_s$ from the sense capacitor 220 is fed into an amplifier module 240 having a transimpedance configuration, i.e., where the output voltage $V_o$ of the amplifier module is proportional to the sense current $I_s$ input to the amplifier module. Preferably, the transimpedance amplifier configuration is fully implemented "on-chip" as part of an integrated circuit for the power converter and/or other relevant applications.

In an embodiment, the transimpedance amplifier 240 has a voltage feedback configuration that includes an operational amplifier 230 having a series resistor 232 coupled in series between the sense capacitor 220 and the inverting input of the op amp, a feedback resistor 234 coupled between the output and the inverting input of the op amp, and a voltage reference $V_{ref}$ coupled to the non-inverting input of the op amp. In this configuration, the output voltage $V_o(s)$ is directly proportional to the resonant current $I_r$ expressed in the following transfer function:

$$V_o(s) = \frac{1}{(R_s C_s j\omega + 1)} \times \frac{R_f C_s}{(C_s + C_r)} \times I_r$$

where $R_s$ is the value of the series resistor 232; $C_r$ is the value of the sense capacitor 220; $C_r$ is the value of the resonant capacitor 108; $R_f$ is the value of the feedback resistor 234; and ω is the frequency in radians per second.

Voltage-feedback ("VFB") operational amplifiers typically suffer from bandwidth and stability limits in this application. For example, VFB amplifiers are known to have a single dominant pole above the crossover frequency (GWBP) that provides unity-gain stability, but also numerous poles after the crossover frequency. The added zero in the feedback path reduces the phase margin by 90 degrees and causes instability unless $R_s$ is made large enough to create a cancelling pole at a low enough frequency. Further, a substantial $R_s$ reduces the current sense bandwidth by several orders of magnitude below the amplifier GWBP.

Figure 3:
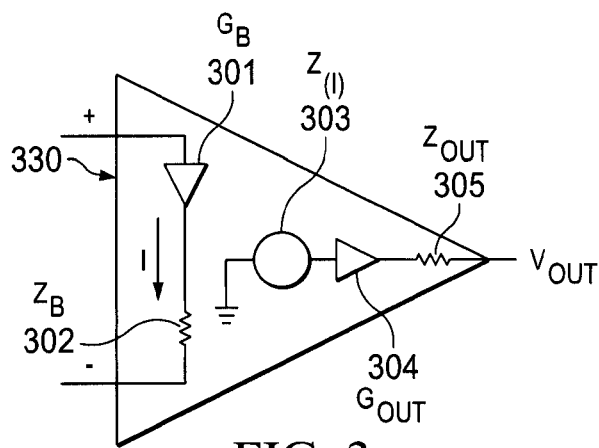
FIG. 3 is a schematic block diagram of a current feedback amplifier that may be used in the circuit shown in FIG. 2.

FIG. 3 is a schematic block diagram of a current feedback amplifier ("CFB") 330 that may be used to replace the VFB amplifier 230 shown in the transimpedance amplifier of FIG. 2. The non-inverting input of the CFB 330 is coupled to the input of buffer 301 inside the op amp 330. The inverting input of the CFB is coupled to the output of buffer 301 inside the op amp 330. The buffer 301 has an impedance $Z_B$ represented by resistance 302, and a gain $G_B$. A current I is developed through the impedance $Z_B$ and is known as an error current. The current feedback amplifier 330 includes a voltage source 303 that develops voltage Z(I), a function of the current I through buffer 301, which is buffered through output buffer 304 to generate an output voltage $V_{OUT}$. The output buffer 304 has an impedance $Z_{OUT}$ represented by resistance 305.

The substitution of a CFB amplifier 330 for the VFB amplifier 230 allows the transimpedance network shown in FIG. 2 to include the same components, but the bandwidth and stability of the network is dramatically improved by using the CFB amplifier. Further, the series resistor 232 is not needed for stability when a CFB amplifier is used and is therefore optional in this embodiment. However, the presence of the series resistor 232 allows the bandwidth of the network to be reduced to control noise at very high frequencies. The feedback resistor 234 is necessary to determine the DC gain of the transimpedance amplifier circuit.

Figure 4:
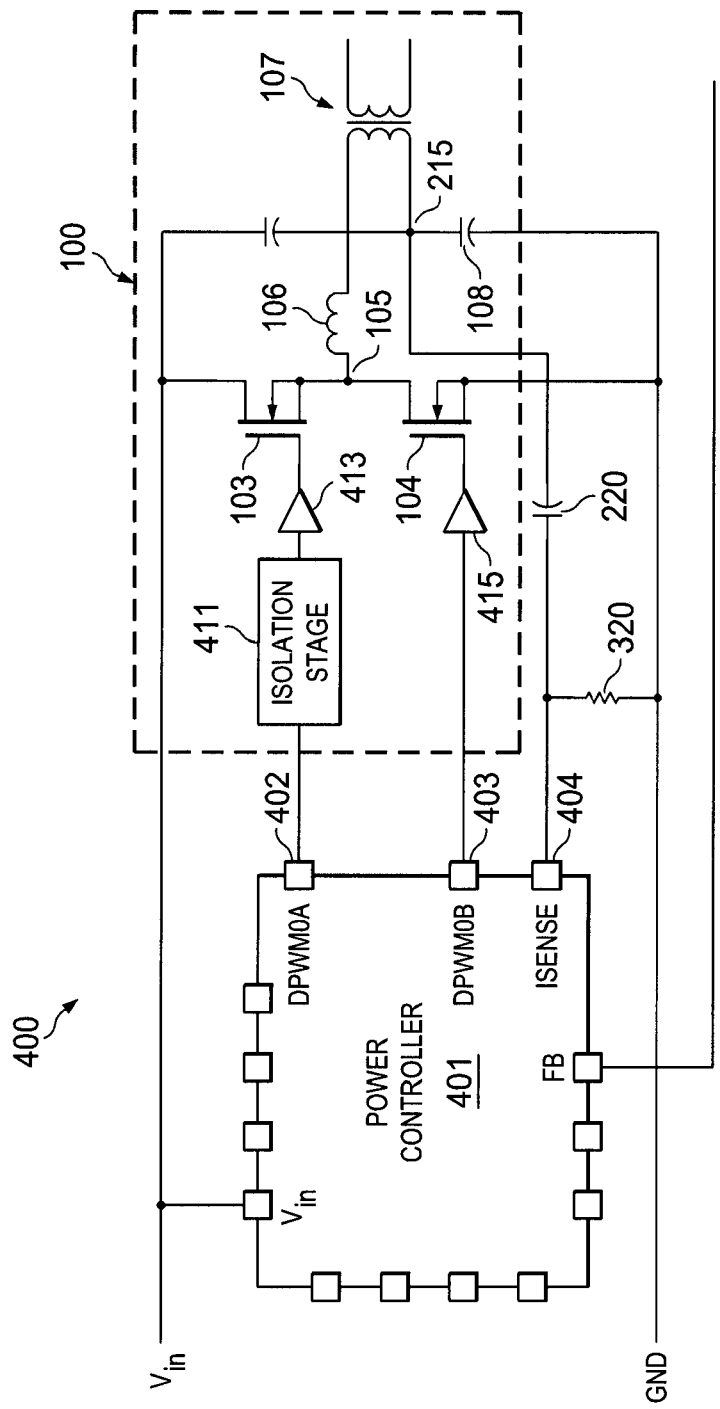
FIG. 4 is a circuit schematic of an integrated circuit that incorporates the transimpedance amplifier of FIG. 2.

FIG. 4 is a circuit schematic of an application specific integrated circuit 400 implementing the transimpedance amplifier of FIG. 2. The application circuit 400 for a DC-DC converter includes an integrated circuit chip 401 that provides pulse width modulation controller functions for the application circuit. For example, the IC chip 401 generates a first pulse width modulated signal DPWM0A output at pin 402 and a second pulse width modulated signal DPWM0B output at pin 403. These pulse width modulated signals are coupled to an external converter circuit, such as circuit 100. The first signal DPWM0A is coupled to an isolation stage 411; the output of the isolation stage is coupled to a gate driver integrated circuit 413; and the output of the gate drive circuit 413 is coupled to the gate of the high-side transistor 103. The second signal DPWM0B is coupled to a gate driver IC 415, and the output of the gate drive circuit 415 is coupled to the gate of the low-side transistor 104.

In an embodiment, the sense capacitor 220 is coupled to node 215, and the output of the sense capacitor is coupled as input to the controller 401 via pin 404, where the output of the sense capacitor is coupled to a transimpedance amplifier that is formed on-chip as part of the controller 401. Resistor 320 is used with a voltage amplifier to form a transimpedance amplifier. However, if a trans-impedance amplifier is provided internal to the controller IC 401, then resistor 320 need not be used, as described above.

The transimpedance amplifier can also be implemented using a common-gate amplifier stage or common-base amplifier stage as a first stage or input stage to a multi-stage transistor amplifier. This method will reduce the complexity of the amplifier and reduce power consumption for a given bandwidth, but will reduce accuracy somewhat if feedback around the amplifier is not used. The lack of accuracy can be acceptable if the current measurement is only used for cycle-by-cycle current control as well as fault and short-circuit protection.

Capacitive current sensing using a transimpedance configuration may be extended to other forms of switching power converters. For example, the circuit can be used to sense current in a voltage-doubler output stage in LLC and other isolated transformer topologies. Capacitive current sensing may also be used to detect current reversal in an output stage to turn on and off transistors used for synchronous rectification purposes.

Although illustrative embodiments have been shown and described by way of example, a wide range of alternative embodiments is possible within the scope of the foregoing disclosure.

The invention claimed is:

1. A circuit for sensing current flowing through a capacitor, comprising:
   a sense capacitor having a first terminal and a second terminal, wherein the first terminal is coupled at a node to a first terminal of a resonant capacitor and to a first terminal of a primary winding of a transformer of a resonant isolated power converter, wherein a second terminal of the primary winding is coupled to a switching node wherein a sense current flowing through the sense capacitor is proportional to a resonant current flowing through the resonant capacitor, and wherein a second terminal of the resonant capacitor is coupled to a common reference; and
   a transimpedance amplifier having: a first input coupled to the second terminal of the sense capacitor; a second input coupled to a voltage reference; and a voltage output that is proportional to the sense current flowing through the sense capacitor.

2. The circuit of claim 1, wherein the transimpedance amplifier utilizes a common-gate amplifier or a common-source amplifier as an input stage.

3. The circuit of claim 1, wherein the transimpedance amplifier is a current feedback amplifier.

4. The circuit of claim 3, wherein: the current feedback amplifier is an operational amplifier, the first input is an inverting input of the operational amplifier, the second input is a non-inverting input of the operational amplifier, and the voltage output is from an output of the operational amplifier; the first input is coupled through a series resistor to the second terminal of the sense capacitor; a feedback resistor is coupled between the output of the operational amplifier and the inverting input of the operational amplifier; and the second terminal of the primary winding is coupled through an inductor to the switching node.

5. The circuit of claim 1, wherein the transimpedance amplifier is formed as part of an integrated circuit, and the sense capacitor is external to the integrated circuit.

6. A circuit for sensing current in a series-resonant DC-DC isolated power converter, comprising:
  at least one resonant capacitor coupled between a first node and a common reference, the resonant capacitor for conducting a primary current, and the first node being coupled to a first terminal of a primary winding of a transformer of the series-resonant DC-DC isolated power converter, wherein a second terminal of the primary winding is coupled to a switching node;
  a sense capacitor having a first terminal and a second terminal, wherein the first terminal is coupled to the first node, wherein a sense current flowing through the sense capacitor is proportional to the primary current flowing through the resonant capacitor; and
  a transimpedance amplifier having: a first input coupled to the second terminal of the sense capacitor; a second input coupled to a voltage reference; and a voltage output that is proportional to the sense current flowing through the sense capacitor.

7. The circuit of claim 6, wherein the transimpedance amplifier utilizes a common-gate amplifier or a common-source amplifier as an input stage.

8. The circuit of claim 6, wherein the transimpedance amplifier is implemented as a current feedback amplifier.

9. The circuit of claim 8, wherein: the current feedback amplifier is an operational amplifier, the first input is an inverting input of the operational amplifier, the second input is a non-inverting input of the operational amplifier, and the voltage output is from an output of the operational amplifier; the first input is coupled through a series resistor to the second terminal of the sense capacitor; a feedback resistor is coupled between the output of the operational amplifier and the inverting input of the operational amplifier; and the second terminal of the primary winding is coupled through an inductor to the switching node.

10. A method for sensing current flowing through a capacitor, comprising:
  coupling a first terminal of a resonant capacitor to a first terminal of a primary winding of a transformer of a resonant isolated power converter, and coupling a second terminal of the resonant capacitor to a common reference, the resonant capacitor having a resonant current flowing through the resonant capacitor, and a second terminal of the primary winding being coupled to a switching node;
  forming a current divider by coupling a first terminal of a sense capacitor to the first terminal of the resonant capacitor, wherein a sense current flowing through the sense capacitor is proportional to the resonant current; and
  coupling a first input of a transimpedance amplifier to a second terminal of the sense capacitor, and coupling a second input of the transimpedance amplifier to a voltage reference, wherein a voltage output of the transimpedance amplifier is proportional to the sense current flowing through the sense capacitor.

11. The method of claim 10, wherein the transimpedance amplifier utilizes a common-gate amplifier or a common-source amplifier as an input stage.

12. The method of claim 10, wherein the transimpedance amplifier is a current feedback amplifier.

13. The method of claim 12, wherein: the current feedback amplifier is an operational amplifier, the first input is an inverting input of the operational amplifier, the second input is a non-inverting input of the operational amplifier, and the voltage output is from an output of the operational amplifier; the first input is coupled through a series resistor to the second terminal of the sense capacitor; a feedback resistor is coupled between the output of the operational amplifier and the inverting input of the operational amplifier; and the second terminal of the primary winding is coupled through an inductor to the switching node.

* * * * *